(12) United States Patent
Subramani et al.

(10) Patent No.: US 12,170,186 B2
(45) Date of Patent: Dec. 17, 2024

(54) SHOWERHEAD ASSEMBLY WITH HEATED SHOWERHEAD

(71) Applicant: Applied Materials, Inc., Santa Clara, CA (US)

(72) Inventors: Anantha K. Subramani, San Jose, CA (US); Seyyed Abdolreza Fazeli, Santa Clara, CA (US); Yang Guo, San Mateo, CA (US); Chandrashekara Baginagere, Bangalore (IN); Ramcharan Sundar, Bangalore (IN); Yunho Kim, San Jose, CA (US); Rajasekhar Patibandla, Bangalore (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 368 days.

(21) Appl. No.: 17/721,417

(22) Filed: Apr. 15, 2022

(65) Prior Publication Data

US 2023/0335377 A1    Oct. 19, 2023

(51) Int. Cl.
*H01J 37/32* (2006.01)
*C23C 16/455* (2006.01)
*C23C 16/505* (2006.01)

(52) U.S. Cl.
CPC .... *H01J 37/3244* (2013.01); *C23C 16/45565* (2013.01); *C23C 16/505* (2013.01);
(Continued)

(58) Field of Classification Search
CPC .............. C23C 16/4557; C23C 16/505; C23C 16/45565; C23C 16/4488; C23C 16/34;
(Continued)

(56) References Cited

U.S. PATENT DOCUMENTS 6,123,775 A * 9/2000 Hao .................. C23C 16/45572
                                                              118/724
6,827,815 B2   12/2004 Hytros et al.
(Continued)

FOREIGN PATENT DOCUMENTS

CN      204134770 U        2/2015
JP       08148472 A  *     6/1996
KR     10-2099886 B1       4/2020

OTHER PUBLICATIONS

PCT International Search Report and Written Opinion for PCT/US2022/036314 dated Jan. 10, 2023.
(Continued)

*Primary Examiner* — Yuechuan Yu
(74) *Attorney, Agent, or Firm* — Moser Taboa

(57) ABSTRACT

Methods and apparatus for substrate processing are described. In some embodiments a showerhead assembly includes a heated showerhead having a heater and a gas diffusion plate coupled to the heater, the gas diffusion plate having a plurality of channels extending through the gas diffusion plate; an ion filter spaced from the heated showerhead, the ion filter having a first side facing the heated showerhead and a second side opposite the first side, the ion filter having a plurality of channels extending through the ion filter; a heat transfer ring in contact between the heated showerhead and the ion filter, the heat transfer ring being thermally conductive and electrically insulative, the heat transfer ring comprised of a plurality of elements spaced from one another along an interface between the heated showerhead and the ion filter; and a remote plasma region defined between the heated showerhead and the ion filter.

20 Claims, 3 Drawing Sheets

(52) U.S. Cl.
CPC .. *H01J 37/32357* (2013.01); *H01J 37/32422* (2013.01); *H01J 2237/332* (2013.01)

(58) Field of Classification Search
CPC ........... H01J 37/32422; H01J 37/32357; H01J 37/3244; H01J 2237/332
See application file for complete search history.

(56) References Cited

U.S. PATENT DOCUMENTS

| | | | | |
|---|---|---|---|---|
| 6,830,007 | B2* | 12/2004 | Matsuki | C23C 16/401 |
| | | | | 156/345.43 |
| 7,722,925 | B2* | 5/2010 | White | H01J 37/3244 |
| | | | | 427/248.1 |
| 11,069,514 | B2 | 7/2021 | Shah et al. | |
| 2002/0129769 | A1 | 9/2002 | Kim et al. | |
| 2009/0151639 | A1 | 6/2009 | Kasai et al. | |
| 2011/0030615 | A1* | 2/2011 | Griffin | C23C 16/45565 |
| | | | | 134/19 |
| 2012/0031559 | A1 | 2/2012 | Dhindsa et al. | |
| 2012/0114856 | A1 | 5/2012 | Park et al. | |
| 2012/0322011 | A1 | 12/2012 | Wu et al. | |
| 2015/0371825 | A1 | 12/2015 | Kobayashi et al. | |
| 2017/0211185 | A1 | 7/2017 | Du Bois et al. | |
| 2019/0078210 | A1 | 3/2019 | Gungor et al. | |
| 2020/0098549 | A1 | 3/2020 | Park et al. | |

OTHER PUBLICATIONS

International Search Report for PCT/US2023/029804, dated Nov. 29, 2023.

\* cited by examiner

SHOWERHEAD ASSEMBLY WITH HEATED SHOWERHEAD

FIELD

Embodiments of the present disclosure generally relate to semiconductor processing equipment, and, more particularly, to showerhead assemblies used in semiconductor processing equipment.

BACKGROUND

Substrate processing equipment generally includes process chambers configured to perform certain processes on a substrate, for example, chemical vapor deposition (CVD), atomic layer deposition (ALD), etching, or the like. Some Process chambers may use showerheads to dispense process gases over substrates when performing certain processes, such as plasma processing. However, the inventors have observed that, in some applications, when the temperature of the showerhead (or portions thereof) is too low, some amount of condensation of material from the plasma can occur, resulting in a reduction in deposition density of material on the substrate.

Accordingly, the inventors have provided embodiments of improved showerheads as disclosed herein.

SUMMARY

Methods and apparatus for substrate processing are provided herein. In some embodiments, a showerhead assembly for use in a process chamber includes a heated showerhead having a heater and a gas diffusion plate coupled to the heater, the gas diffusion plate having a plurality of channels extending through the gas diffusion plate; an ion filter spaced from the heated showerhead, the ion filter having a first side facing the heated showerhead and a second side opposite the first side, the ion filter having a plurality of channels extending through the ion filter; a heat transfer ring in contact between the heated showerhead and the ion filter, the heat transfer ring being thermally conductive and electrically insulative configured to transfer heat from the heated showerhead to the ion filter, the heat transfer ring comprised of a plurality of elements spaced from one another along an interface between the heated showerhead and the ion filter; and a remote plasma region defined between the heated showerhead and the ion filter.

In some embodiments, a showerhead assembly for use in a process chamber includes a heated showerhead having a gas diffusion plate and a heater plate connected to the gas diffusion plate, the heater plate extending parallel to and being spaced axially from the gas diffusion plate to define a first plenum between the gas diffusion plate and the heater plate, the gas diffusion plate having a plurality of channels extending through the gas diffusion plate, and the heated showerhead having a first flange surrounding the plurality of channels of the gas diffusion plate; an ion filter spaced from the heated showerhead, the ion filter having a first side facing the heated showerhead and a second side opposite the first side, the ion filter having a plurality of channels extending through the ion filter; the ion filter having a second flange surrounding the plurality of channels of the ion filter, the ion filter spaced axially from the gas diffusion plate to define a second plenum between the gas diffusion plate and the ion filter; and a heat transfer ring in contact between the first flange and the second flange, the heat transfer ring being thermally conductive and configured to transfer heat from the heated showerhead to the ion filter, the heat transfer ring being an electrical insulator, wherein the heat transfer ring is comprised of a plurality of elements spaced from one another along an interface between the first flange and the second flange.

In some embodiments, a process chamber includes a chamber body having an interior volume; a substrate support disposed in the interior volume; a showerhead assembly disposed in the interior volume opposite the substrate support, wherein the showerhead assembly comprises: a heated showerhead having a heater and a gas diffusion plate coupled to the heater, the gas diffusion plate having a plurality of channels extending through the gas diffusion plate; an ion filter spaced from the heated showerhead, the ion filter having a first side facing the heated showerhead and a second side opposite the first side, the ion filter having a plurality of channels extending through the ion filter; a heat transfer ring in contact between the heated showerhead and the ion filter, the heat transfer ring configured to transfer heat from the heated showerhead to the ion filter being thermally conductive and electrically insulative, the heat transfer ring comprised of a plurality of elements spaced from one another along an interface between the heated showerhead and the ion filter; a remote plasma region defined between the heated showerhead and the ion filter; and a direct plasma region defined between the ion filter and the substrate support.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
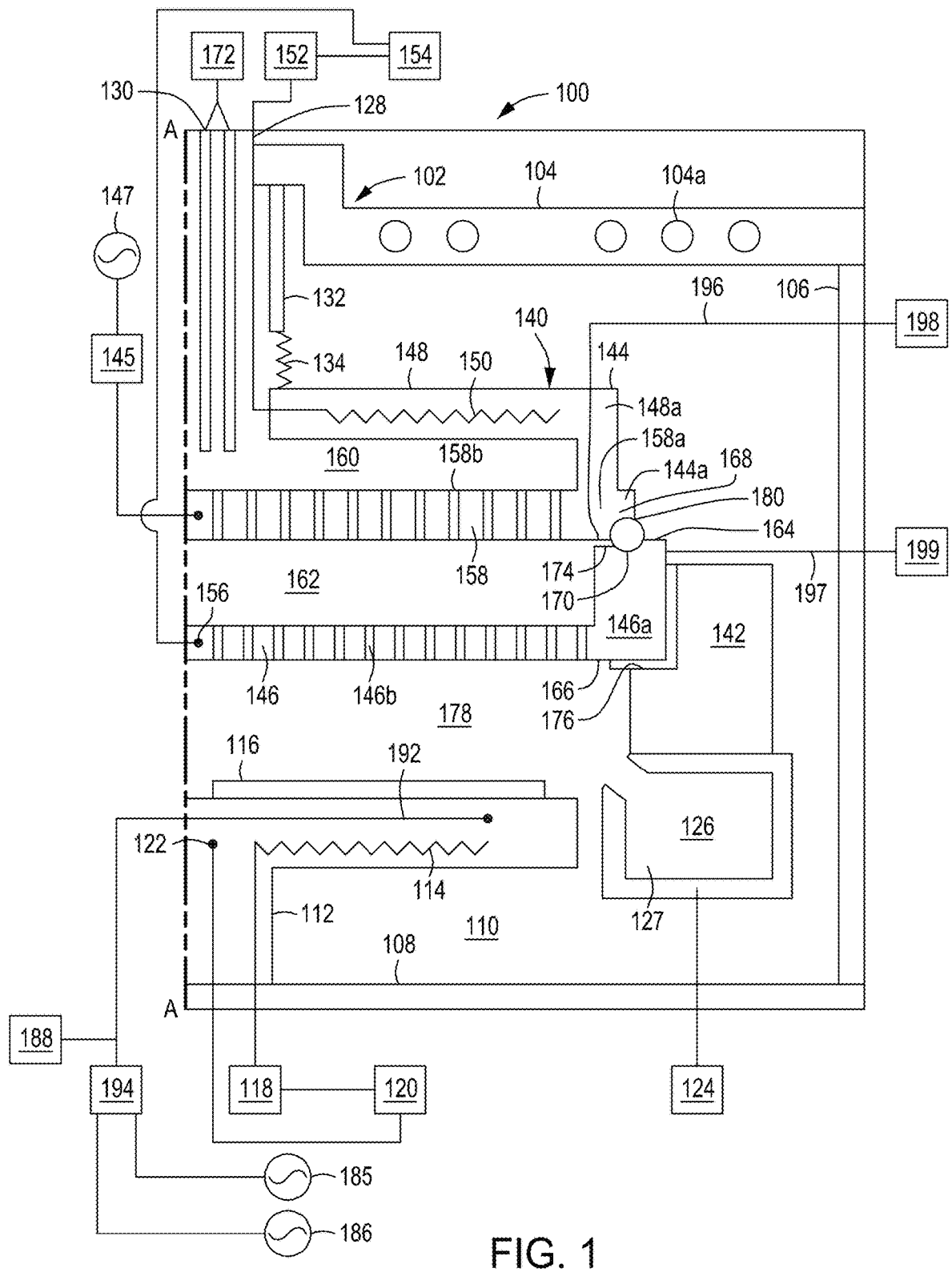
FIG. 1 is a partial schematic section view of a processing chamber in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of apparatus and methods for providing plasma to a process chamber that may reduce or eliminate condensation of material from plasma are described.

The inventors have observed that some showerheads in plasma processing chambers operate at temperatures that allow material to condense from plasma before reaching a substrate. The condensation of material can reduce deposition density and/or uniformity of materials deposited on the substrate. In accordance with one aspect, a showerhead assembly is described that includes a heated showerhead, an ion filter, and a heat transfer ring that can transfer heat from the heated shower head to the ion filter to elevate and control the temperature of the entire showerhead assembly above a temperature at which materials in the plasma condense, which can improve deposition density and/or uniformity of materials deposited on the substrate.

FIG. 1 is a partial cross-sectional view of a processing chamber 100 suitable for depositing material (e.g., $TiCl_3$) on a substrate. The processing chamber 100 may be any process chamber suitable for plasma enhanced semiconductor processing, for example, such as a process chamber configured to perform a plasma assisted chemical vapor deposition (CVD) or an atomic layer deposition (ALD) process. Exemplary process chambers may include the ENDURA®, PRODUCER® or CENTURA® platform process chambers, or other process chambers, available from Applied Materials, Inc. of Santa Clara, California. Other processing systems, including those produced by other manufacturers, may benefit from embodiments described herein.

Accordingly, in some embodiments, and as shown in FIG. 1, the processing chamber 100 includes a chamber body 102 having a lid 104, a side wall 106, and a bottom wall 108 that define an interior volume 110. A pedestal 112 is provided in the interior volume 110 of the processing chamber 100. The pedestal 112 may be fabricated from aluminum, ceramic, and other suitable materials. In some embodiments, the pedestal 112 is fabricated from a ceramic material, such as aluminum nitride, which is a material suitable for use in a high temperature environment, such as a plasma process environment, without causing thermal damage to the pedestal 112. The pedestal 112 may be moved in a vertical direction along axis A-A in the interior volume 110 using a lift mechanism (not shown).

The pedestal 112 may include an embedded heater element 114 suitable for controlling the temperature of a substrate 116 supported on the pedestal 112. In some embodiments, the pedestal 112 may be resistively heated by applying an electric current from a power supply 118 to the heater element 114. In some embodiments, the heater element 114 may be made of a nickel-chromium wire encapsulated in a nickel-iron-chromium alloy (e.g., INCOLOY®) sheath tube. The electric current supplied from the power supply 118 is regulated by a controller 120 to control the heat generated by the heater element 114, thereby maintaining the substrate 116 and the pedestal 112 at a substantially constant temperature during film deposition at any suitable temperature range.

A temperature sensor 122, such as a thermocouple, may be embedded in the pedestal 112 to monitor the temperature of the pedestal 112 in a conventional manner. The measured temperature is used by the controller 120 to control the power supplied to the heater element 114 to maintain the substrate at a desired temperature.

The pedestal 112 generally includes a plurality of lift pins (not shown) disposed therethrough that are configured to lift the substrate 116 from the pedestal 112 and facilitate exchange of the substrate 116 with a robot (not shown) in a conventional manner.

A vacuum pump 124 is coupled to a port formed in the bottom wall 108 of the chamber body 102 and to a pumping ring 126 that surrounds the pedestal 112. The pumping ring 126 has a fluid passageway 127 in fluid communication with a processing volume 178. The vacuum pump 124 is used to maintain a desired gas pressure in the processing chamber 100. The vacuum pump 124 also evacuates post-processing gases and by-products of the process from the processing chamber 100 through the pumping ring 126.

In some embodiments, and as shown in FIG. 1, the lid 104 includes a plurality of fluid channels 104a extending within the lid. The fluid channels 104a are fluidly coupled to a supply of heat transfer fluid (e.g., water). The fluid channels 104a configured to flow the heat transfer fluid to control the temperature of the lid 104 and the interior volume 110. The lid 104 also includes an opening 128 through which a plurality of gas conduits 130 extend. In some embodiments, the lid 104 may be formed from aluminum. In some embodiments, and as shown in FIG. 1, the gas conduits 130 are at least partially surrounded by an outer tube 132 extending down from the lid 104 and a bellows 134 that extend down from the outer tube 132.

The bellows 134 supports a showerhead assembly 140. In embodiments, the bellows 134 permits some movement of the showerhead assembly 140 in an axial direction along axis A-A. Also, the showerhead assembly 140 is supported by an insulator ring 142, which is supported by the pumping ring 126. The insulator ring 142 may comprise any process compatible electrically insulating material. For example, in some embodiments, the electrical insulator ring may be fabricated from quartz ($SiO_2$), a sintered ceramic such as aluminum oxide ($Al_2O_3$) or silicon nitride (SiN), or a single crystal sapphire ($Al_2O_3$).

The showerhead assembly 140 includes a heated showerhead 144, an ion filter 146, and a heat transfer ring 180 in contact between the heated showerhead 144 and the ion filter 146. The heated showerhead 144 includes a heater plate having a central opening through which the gas conduits 130 extend. The heater plate 148 is connected along an upper side to the bellows 134. In embodiments, the heater plate 148 may include an embedded heater element 150 suitable for controlling the temperature of the showerhead assembly 140. In some embodiments, the heater plate 148 may be resistively heated by applying an electric current from a power supply 152 to the heater element 150. In some embodiments, the heater element 150 may be made of a nickel-chromium wire encapsulated in a nickel-iron-chromium alloy (e.g., INCOLOY®) sheath tube. The electric current supplied from the power supply 152 is regulated by a controller 154 to control the heat generated by the heater element 150, thereby maintaining the ion filter 146 at a substantially constant temperature during film deposition at any suitable temperature range. The supplied electric current may be adjusted to selectively control the temperature of the ion filter above 575 degrees Celsius.

A temperature sensor 156, such as a thermocouple, may be embedded in the ion filter 146 to monitor the temperature of the ion filter 146. Since the ion filter 146 is located in a region of the showerhead assembly 140 where plasma will be present and condensation may occur, the temperature of the ion filter 146 is used to control the heater element 150. Thus, in some embodiments, and as shown in FIG. 1, the measured temperature of the ion filter 146 is used by the controller 154 to control the power supplied to the heater element 150 to maintain the ion filter 146 at a desired temperature above a condensation temperature of species in plasma.

The heated showerhead 144 also includes a gas diffusion plate 158 extending parallel to the heater plate 148. In some embodiments, and as shown in FIG. 1, the gas diffusion plate 158 and the heater plate 148 are connected at their respective outer edges 158a and 148a and define a first plenum 160. The gas diffusion plate 158 includes a plurality of through holes 158b, which permit the flow of gas from the gas conduits 130 through the gas diffusion plate 158. In some embodiments, the heater plate 148 and the gas diffusion plate 158 may be formed from nickel.

The ion filter 146 extends parallel to, and is axially spaced from, the gas diffusion plate 158. A second plenum 162 is defined between the ion filter 146 and the gas diffusion plate 158. In some embodiments, and as shown in FIG. 1, the ion filter 146 has a flange 146a with an upper side 164 that faces a flange 144a of the heated showerhead 144. Also, the flange 146a of the ion filter 146 has a lower side 166 that faces the insulator ring 142. The flanges 144a and 146a include respective grooves 168, 170 defining an interface between the heated showerhead 144 and the ion filter 146. The grooves 168, 170 may extend along a circular interface centered about axis A-A. In some embodiments, and as shown in FIG. 1, the grooves 168, 170 may have a cross sectional profile that is arcuate, although other shapes may be used. The ion filter 146 includes a plurality of through holes 146b that permit the flow of gas through the ion filter 146. In some embodiments, the ion filter 146 may be formed from nickel.

In some embodiments, the through holes 158b in the gas diffusion plate 158 and the through holes 146b in the ion filter 146 may be utilized to introduce gases from a gas panel 172 into the processing chamber 100 through the gas conduits 130 and the showerhead assembly 140. The through holes 158b, 146b may have different sizes, number, and distributions, shape, design, and diameters to facilitate the flow of the various process gases for different processing purposes. For example, in some embodiments, a plasma may be formed from a process gas mixture exiting the showerhead assembly 140 to enhance thermal decomposition of the process gases in the process gas mixture resulting in the deposition of material on the surfaces of the substrate.

Figure 2:
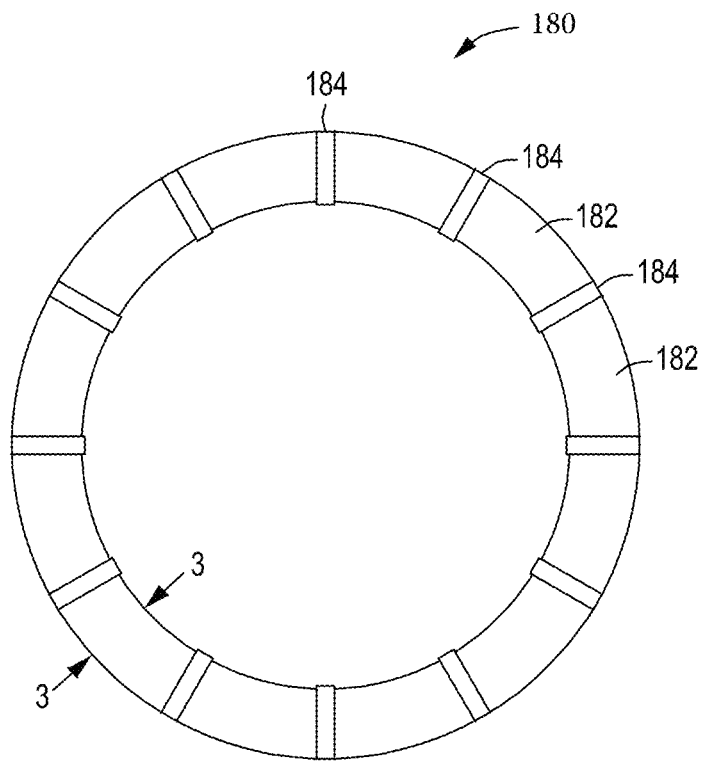
FIG. 2 is a plan view of a heat transfer ring in accordance with at least some embodiments of the present disclosure.

The heat transfer ring 180 is seated in the grooves 168 and 170 at the interface between the flanges 144a and 146a. The heat transfer ring 180 is thermally conductive and electrically insulative. In some embodiments, the heat transfer ring 180 is formed from aluminum nitride. As shown in greater detail in FIG. 2, and in some embodiments, the heat transfer ring 180 includes a plurality of elements 182 that are configured to be arranged along the interface. In the example embodiment shown in FIG. 2, the elements 182 are formed as arcuate segments and are arranged along a circle. The elements 182 are spaced from one another by gaps 184 that are of a sufficient size to permit the elements 182 to expand based on the coefficient of thermal expansion of the material of the elements 182 and fill the gaps without cracking or otherwise damaging the elements 182 when the elements 182 are at or above a predetermined temperature. In one example, at room temperature, the gap 184 between the elements is about 5 mm to 7 mm to allow the elements to expand when the process temperature is 575 degrees Celsius to 600 degrees Celsius. Also, since the gaps 184 between the elements 182 may create leak paths if not closed or restricted, operationally the temperature of the heat transfer ring 180 may be raised to cause the elements 182 to expand to reduce the size of the gaps 184 prior to introducing gas into the showerhead assembly 140 through gas conduits 130.

Figure 3:
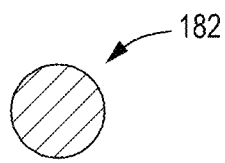
FIG. 3 is a section view through the heat transfer ring of FIG. 2 along line 3-3.

In some embodiments, and as shown in FIG. 3, the cross-section of the elements 182 may be circular cross-section or a tubular cross-section. In some embodiments, the heat transfer ring 180 includes at least fifteen elements. In some embodiments, the heat transfer ring includes eighteen to thirty-six elements.

As shown in FIG. 1, when the heat transfer ring 180 is seated in the grooves 168, 170, the flanges 144a and 146a remain spaced from one another by a gap 174. Thus, in some embodiments, the heated showerhead 144 and the ion filter 146 are not in direct contact with one another, but only indirectly connected by the heat transfer ring 180. In some embodiments, the gap 174 is about 5 mm to 7 mm. The gap 174 provides a plasma confinement feature for remote plasma in the second plenum 162. The gap 174 is in fluid communication with the second plenum 162. In embodiments, the gap 174 is in fluid communication with a purge channel 196 and supply of purge gas 198. In embodiments, prior to introduction of process gases into the showerhead assembly 140 through gas conduits 130, purge gas may be introduced into the second plenum 162 through the purge channel 196 and the gap 174.

In some embodiments, and as shown in FIG. 1, the flange 146a of the ion filter 146 may be spaced from the insulator ring 142 by a gap 176. The gap 176 may be about 5 mm to 7 mm. The gap 176 may aid in direct plasma confinement between the ion filter 146 and the substrate 116. The gap 176 is in fluid communication with a processing volume 178 between the ion filter 146 and the substrate 116. In some embodiments, the gap 176 is in fluid communication with a purge channel 197 and a supply of purge gas 199. In some embodiments, prior to introduction of process gases from the gas conduits 130 into the showerhead assembly 140, the purge gas may flow into the processing volume 178 from the purge channel 197 and the gap 176. The pumping ring 126 is also in fluid communication with the processing volume 178. Purge gas in the processing volume 178 can be exhausted from processing volume 178 through the pumping ring 126.

The heated showerhead 144, the ion filter 146, and the pedestal 112 may be configured as electrodes. In one example, the pedestal 112 comprises at least one electrode 192 for retaining the substrate 116 on the pedestal 112. The electrode 192 is driven by a chucking power source 188 to develop an electrostatic force that holds the substrate 116 to the pedestal surface, as is conventionally known. Alternatively, the substrate 116 may be retained to the pedestal 112 by clamping, vacuum, or gravity.

In some embodiments, the pedestal 112 is configured as a cathode having the electrode 192 embedded therein coupled to RF bias power sources 185, 186. Although the example embodiment depicted in FIG. 1 shows two RF bias power sources, 185, 186, the numbers of the RF bias power sources may be any number as needed. The RF bias power sources 185, 186 are coupled between the electrode 192 disposed in the pedestal 112 and another electrode, such as the heated showerhead 144, the ion filter 146, or lid 104 of the processing chamber 100. One or both of the RF bias power sources 185, 186 excite and sustain a plasma discharge formed from the gases disposed in the processing volume 178 of the processing chamber 100.

In the embodiment depicted in FIG. 1, the dual RF bias power sources 185, 186 are coupled to the electrode 192 disposed in the pedestal 112 through a matching circuit 194. The signal generated by the RF bias power sources 185, 186 is delivered through matching circuit 194 to the pedestal 112 through a single feed to ionize the gas mixture provided in the processing chamber 100, thereby providing ion energy necessary for performing a deposition or other plasma enhanced process. The RF bias power sources 185, 186 are generally capable of producing an RF signal having a frequency of from about 50 kHz to about 200 MHz and a power between about 0 Watts and about 5000 Watts.

One or more RF sources 147 provides a bias potential through a matching network to the showerhead assembly 140 to facilitate the generation of a plasma between the showerhead assembly 140 and the pedestal 112. Alternatively, the RF sources 147 and matching network 145 may be coupled to the showerhead assembly 140, pedestal 112, or both, or coupled to an antenna (not shown) disposed external to the processing chamber 100. In some embodiments, the RF sources 147 may provide between about 10 watts and about 3000 watts at a frequency of about 30 kHz to about 13.6 MHz. Alternatively, the RF source 147 may be a microwave generator that provide microwave power to the heated showerhead 144 that assists generation of the plasma in the interior volume 110.

The gas diffusion plate 158 comprises a plurality of through holes 158b that fluidly couple the first plenum 160 to the second plenum 162 to allow for the process gas in the first plenum 160 to pass through the gas diffusion plate 158 and into the second plenum 162. The ion filter 146 includes a plurality of through holes 146b to allow the activated species (e.g., radicals) generated in the plasma to flow from the second plenum 162 to the processing volume 178 of the processing chamber 100. The second plenum 162 provides a second cavity or space to allow for the ignition of the process gas to form the plasma and to further allow for the accumulation of the plasma to facilitate dispersion of the plasma species via the through holes 146b. In some embodiments, during plasma processing, the vacuum pump 124 provides a negative pressure in the processing volume 178 relative to a second plenum 162, thus allowing the species in the second plenum 162 to flow to the processing volume 178. Providing multiple regions for plasma to be formed (e.g., in the second plenum 162 and the processing volume 178) provides multiple excitation stages of the plasma to facilitate enhanced radical generation, as compared to plasma sources that may utilize a single cavity to form the plasma.

Prior to use in plasma processing, the showerhead assembly 140 may be seasoned to coat the surfaces of the showerhead assembly 140, for example, with TiN. The seasoning can also control metal from the showerhead assembly from contaminating the substrate during plasma processing. The gas conduits 130 may be connected to supplies of various gases such as $TiCl_4$, $N_2$, and $NH_3$. In at least some embodiments, the first plenum 160 may be purged with $N_2$ from the gas conduits 130, second plenum 162 may be purged with $N_2$ supplied through gap 174, and the processing volume 178 may be purged with a $N_2$ supplied through gap 176. Once purged, the $TiCl_4$ and $NH_3$ be introduced separately into the first plenum 160 and heated and mixed in the first plenum 160 while the heater is operating and the temperature of the ion filter 146 is at or above 575 degrees Celsius. By mixing and heating the $TiCl_4$ and $NH_3$ in the first plenum, low temperature mixing of the $TiCl_4$ and $NH_3$ can be minimized, thereby facilitating thermal TiN seasoning. Once the showerhead assembly 140 is thermally seasoned, the first plenum 160, second plenum 162, and processing volume 178 can be purged again as discussed above before reactant gas in introduced into the showerhead assembly 140 through gas conduits 130 for plasma processing.

Figure 4:
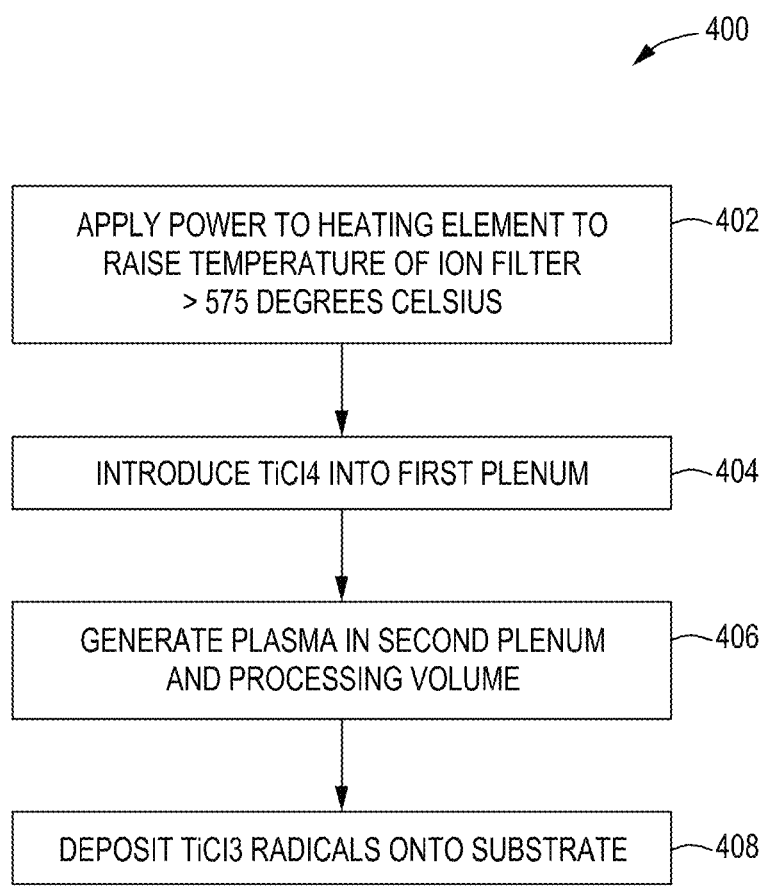
FIG. 4 is a flow chart of a method of a plasma processing method in accordance with at least some embodiments of the present disclosure.

FIG. 4 illustrates a plasma processing method 400 in accordance with the disclosure. The method may be performed after seasoning the showerhead assembly 140. The exemplary method described herein is described in the context of $TiCl_3$ deposition from $TiCl_4$. However, the method is not limited to such materials. At block 402, the heater element 150 is turned on to raise the temperature of the ion filter 146 to a temperature at which species in the desired gas plasma do not condense (e.g., at least 575 degrees Celsius). At block 404 process gases (e.g., $H_2$, $TiCl_4$) are separately introduced into the first plenum 160 through the gas panel 172 and the gas conduits 130. The process gases mix and are heated in the first plenum 160 and flow through the through holes 158b of the gas diffusion plate 158 into the second plenum 162. At block 406 plasma is generated in the second plenum 162 and the processing volume 178. At block 408 species (e.g., $TiCl_3$) in the second plenum 162 pass through the through holes 146b of the ion filter 146, thus allowing the species to flow to the processing volume 178 and deposit on the surface of the substrate 116. By maintaining the temperature of the ion filter 146 above the temperature at which species in the plasma condense, improved higher species density and uniformity along the substrate 116 can be achieved.

While the foregoing is directed to embodiments of the present disclosure, other and further embodiments of the disclosure may be devised without departing from the basic scope thereof.

The invention claimed is:

1. A showerhead assembly for use in a process chamber, comprising:
   a heated showerhead having a heater and a gas diffusion plate coupled to the heater, the gas diffusion plate having a plurality of channels extending through the gas diffusion plate;
   an ion filter spaced from the heated showerhead, the ion filter having a first side facing the heated showerhead and a second side opposite the first side, the ion filter having a plurality of channels extending through the ion filter;
   a heat transfer ring in contact with the heated showerhead and the ion filter, the heat transfer ring being thermally conductive and electrically insulative, the heat transfer ring comprised of a plurality of elements separated from one another along an interface between the heated showerhead and the ion filter; and
   a remote plasma region defined between the heated showerhead and the ion filter.

2. The showerhead assembly of claim 1, wherein the plurality of elements have a circular cross-section.

3. The showerhead assembly of claim 2, wherein the plurality of elements are circumferentially spaced from one another by a gap of 0.5 mm to 0.7 mm.

4. The showerhead assembly of claim 1, wherein the plurality of elements are formed from aluminum nitride.

5. The showerhead assembly of claim 1, wherein the heat transfer ring is disposed between an outer edge of the heated showerhead and an outer edge of the ion filter, and further comprising a gap between the outer edge of the heated showerhead and the outer edge of the ion filter, the gap being 0.5 to 0.7 mm.

6. The showerhead assembly of claim 5, wherein the gap is coupled to a purge channel configured to direct purge gas into the gap.

7. The showerhead assembly of claim 5, wherein the heater generates at least 4 KW to maintain a temperature of the ion filter at or above 575 degrees Celsius when the heater is operated at a temperature of at least 750 degrees Celsius.

8. The showerhead assembly of claim 1, wherein the heated showerhead and the ion filter are formed from nickel.

9. A showerhead assembly for use in a process chamber, comprising:
   a heated showerhead having a gas diffusion plate and a heater plate connected to the gas diffusion plate, the heater plate extending parallel to and being spaced axially from the gas diffusion plate to define a first plenum between the gas diffusion plate and the heater plate, the gas diffusion plate having a plurality of channels extending through the gas diffusion plate, and the heated showerhead having a first flange surrounding the plurality of channels of the gas diffusion plate;

an ion filter spaced from the heated showerhead, the ion filter having a first side facing the heated showerhead and a second side opposite the first side, the ion filter having a plurality of channels extending through the ion filter; the ion filter having a second flange surrounding the plurality of channels of the ion filter, the ion filter spaced axially from the gas diffusion plate to define a second plenum between the gas diffusion plate and the ion filter; and a heat transfer ring in contact with the first flange and the second flange, the heat transfer ring being thermally conductive and configured to transfer heat from the heated showerhead to the ion filter, the heat transfer ring being an electrical insulator, wherein the heat transfer ring is comprised of a plurality of elements separated from one another along an interface between the first flange and the second flange.

10. The showerhead assembly of claim 9, wherein the plurality of elements have a circular cross-section.

11. The showerhead assembly of claim 9, wherein the plurality of elements are circumferentially spaced from one another by a gap of 0.5 mm to 0.7 mm.

12. The showerhead assembly of claim 11, wherein the plurality of elements includes at least 15 elements and wherein the plurality of elements have a coefficient of thermal expansion sufficient to cause the gap between the elements to close when a temperature of the ion filter is above 575 degrees Celsius.

13. The showerhead assembly of claim 9, wherein the heat transfer ring is formed from aluminum nitride.

14. The showerhead assembly of claim 9, further comprising a gap between the first flange and the second flange, the gap being in fluid communication with the second plenum, the gap being 0.5 mm to 0.7 mm.

15. The showerhead assembly of claim 14, wherein the gap is coupled to a purge channel configured to direct purge gas into the gap.

16. A process chamber, comprising:
a chamber body having an interior volume;
a substrate support disposed in the interior volume;
a showerhead assembly disposed in the interior volume opposite the substrate support, wherein the showerhead assembly comprises:
a heated showerhead having a heater and a gas diffusion plate coupled to the heater, the gas diffusion plate having a plurality of channels extending through the gas diffusion plate;
an ion filter spaced from the heated showerhead, the ion filter having a first side facing the heated showerhead and a second side opposite the first side, the ion filter having a plurality of channels extending through the ion filter;
a heat transfer ring in contact with the heated showerhead and the ion filter, the heat transfer ring being thermally conductive and electrically insulative, the heat transfer ring comprised of a plurality of elements separated from one another along an interface between the heated showerhead and the ion filter;
a remote plasma region defined between the heated showerhead and the ion filter; and
a direct plasma region defined between the ion filter and the substrate support.

17. The process chamber of claim 16, wherein the plurality of elements are circumferentially spaced from one another by a gap of 0.5 mm to 0.7 mm.

18. The process chamber of claim 16, wherein the chamber body includes a lid coupled to the showerhead assembly, further comprising a plurality of gas conduits extending between the lid and the heated showerhead, wherein the lid includes fluid channels fluidly coupled to a supply of a heat transfer fluid.

19. The process chamber of claim 16, wherein the heat transfer ring is disposed between an outer edge of the heated showerhead and an outer edge of the ion filter, and
further comprising a gap between the outer edge of the heated showerhead and the outer edge of the ion filter, the gap being 0.5 to 0.7 mm, wherein the gap is coupled to a purge channel configured to direct purge gas into the gap.

20. A process chamber, comprising:
a chamber body having an interior volume;
a substrate support disposed in the interior volume;
a showerhead assembly disposed in the interior volume opposite the substrate support, wherein the showerhead assembly comprises:
a heated showerhead having a heater and a gas diffusion plate coupled to the heater, the gas diffusion plate having a plurality of channels extending through the gas diffusion plate;
an ion filter spaced from the heated showerhead, the ion filter having a first side facing the heated showerhead and a second side opposite the first side, the ion filter having a plurality of channels extending through the ion filter;
a heat transfer ring in contact between the heated showerhead and the ion filter, the heat transfer ring being thermally conductive and electrically insulative, the heat transfer ring comprised of a plurality of elements spaced from one another along an interface between the heated showerhead and the ion filter;
a remote plasma region defined between the heated showerhead and the ion filter;
a direct plasma region defined between the ion filter and the substrate support;
an insulator ring supporting the ion filter spaced above the substrate support; and
a pumping ring supporting the insulator ring,
wherein the insulator ring is at least partly disposed between the ion filter and the pumping ring,
wherein a gap is defined between the insulator ring and the ion filter, the gap being coupled to a supply of purge gas, and the gap being in fluid communication with the direct plasma region, and
wherein the pumping ring has a fluid passageway in fluid communication with the direct plasma region.

* * * * *